United States Patent
Chang et al.

(10) Patent No.: US 10,497,423 B1
(45) Date of Patent: Dec. 3, 2019

(54) FREQUENCY-ADJUSTING CIRCUIT, ELECTRONIC MEMORY, AND METHOD FOR DETERMINING A REFRESH FREQUENCY FOR A PLURALITY OF DRAM CHIPS

(71) Applicant: NANYA TECHNOLOGY CORPORATION, New Taipei (TW)

(72) Inventors: Chuan-Jen Chang, Baoshan Township, Hsinchu County (TW); Wen-Ming Lee, Toufen (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/978,594

(22) Filed: May 14, 2018

(51) Int. Cl.
*G11C 11/406* (2006.01)

(52) U.S. Cl.
CPC .............................. *G11C 11/40626* (2013.01)

(58) Field of Classification Search
None
See application file for complete search history.

(56) References Cited

U.S. PATENT DOCUMENTS

| 2010/0054067 A1 | 3/2010 | Mitchell |
| 2012/0249218 A1 | 10/2012 | Shoemaker |
| 2015/0003172 A1* | 1/2015 | Kim ................. G11C 11/40607 365/189.05 |

* cited by examiner

*Primary Examiner* — James G Norman
(74) *Attorney, Agent, or Firm* — Muncy, Geissler, Olds & Lowe, P.C.

(57) ABSTRACT

The present disclosure provides a frequency-adjusting circuit comprising a temperature-sensing module, a computing module and a storage module. The temperature-sensing module is configured to measure temperatures of a plurality of DRAM chips. The storage module is coupled between the temperature-sensing module and the computing module, and is configured to store the temperatures of the plurality of DRAM chips. the computing module is coupled to the temperature-sensing module and is configured to compare the temperatures of the plurality of DRAM chips measured by the temperature-sensing module to determine a first temperature, to compare previous temperatures of the plurality of DRAM chips read from the storage module to determine a second temperature, and to compare the first temperature with the second temperature to determine a refresh frequency for the plurality of DRAM chips.

20 Claims, 11 Drawing Sheets

FREQUENCY-ADJUSTING CIRCUIT, ELECTRONIC MEMORY, AND METHOD FOR DETERMINING A REFRESH FREQUENCY FOR A PLURALITY OF DRAM CHIPS

TECHNICAL FIELD

The present disclosure relates to a circuit, a memory, and a method for determining a refresh frequency, and more particularly, to a frequency-adjusting circuit, an electronic memory, and a method for determining a refresh frequency for a plurality of dynamic random access memory (DRAM) chips.

DISCUSSION OF THE BACKGROUND

A conventional electronic memory includes eight DRAM chips and a controller. When the controller reads temperatures of the DRAM chips to determine a refresh frequency for the DRAM chips, a controlling system can shut down due to error because the read temperatures of the DRAM chips are different from each other.

A conventional method for solving the system-shutdown problem is to maintain the temperatures of all the DRAM chips at a preset temperature.

However, when the temperatures of the DRAM chips are maintained at the preset temperature, the refresh frequency for the DRAM chips is also fixed. As a result, with any decrease in the temperatures of the DRAM chips, the fixed refresh frequency would lead to a power-consumption problem. Therefore, there is a need to find a solution to the power-consumption problem.

This Discussion of the Background section is for background information only. The statements in this Discussion of the Background are not an admission that the subject matter disclosed in this section constitutes a prior art to the present disclosure, and no part of this section may he used as an admission that any part of this application, including this Discussion of the Background section, constitutes prior art to the present disclosure.

SUMMARY

One aspect of the present disclosure provides a frequency-adjusting circuit. The frequency-adjusting circuit comprises a temperature-sensing module and a computing module. The temperature-sensing module is configured to measure temperatures of a plurality of DRAM chips. The computing module is coupled to the temperature-sensing module and is configured to determine a refresh frequency for the plurality of DRAM chips. In some embodiments, the computing module is configured to compare the temperatures of the plurality of DRAM chips measured by the temperature-sensing module to determine a first temperature, to compare previous temperatures of the plurality of DRAM chips to determine a second temperature, and to determine the refresh frequency based on the first temperature and the second temperature.

In some embodiments, the computing module includes a first comparing unit coupled to the temperature-sensing module and configured to compare the temperatures of the plurality of DRAM chips to obtain the first temperature, which is a highest of the temperatures of the plurality of DRAM chips.

In some embodiments, the computing module further includes a second comparing unit configured to compare the previous temperatures of the plurality of DRAM chips to obtain the second temperature, which is a highest of the previous temperatures of the plurality of DRAM chips.

In some embodiments, the computing module further includes a first computing unit, a third comparing unit and a selection unit. In some embodiments, the first computing unit is coupled to the first comparing unit and the second comparing unit, and is configured to obtain a first temperature difference based on the first temperature and the second temperature. In some embodiments, the third comparing unit is coupled to the first computing unit, and is configured to compare the first temperature difference with a first preset temperature difference. In some embodiments, the selection unit is coupled to the first comparing unit, the second comparing unit and the third comparing unit, and is configured to obtain a third temperature based on results of a comparison between the first temperature difference and the first preset temperature difference.

In some embodiments, the computing module further includes a second computing unit coupled to the selection unit and to a second storage unit, wherein the second computing unit is configured to compare the third temperature with a preset temperature set to determine the refresh frequency.

In some embodiments, the preset temperature set includes at least one preset temperature defining a first temperature range and a second temperature range. In some embodiments, the second computing unit is configured to output a first preset frequency if the third temperature falls within the first temperature range, or a second preset frequency if the third temperature falls within the second temperature range.

In some embodiments, the preset temperature set further includes a second preset temperature difference, and a second temperature difference is defined as a difference between the third temperature and the at least one preset temperature. In some embodiments, when the third temperature is increasing and falls within the second temperature range, the second computing unit is configured to output the first preset frequency if the second temperature difference is less than the second preset temperature difference, and configured to output the second preset frequency if the second temperature difference is equal to or greater than the second preset temperature difference.

In some embodiments, the preset temperature set further includes a second preset temperature difference, and a second temperature difference is defined as a difference between the third temperature and the at least one preset temperature. In some embodiments, when the third temperature is decreasing and falls within the first temperature range, the second computing unit is configured to output the second preset frequency if the second temperature difference is less than the second preset temperature difference, and configured to output the first preset frequency if the second temperature difference is equal to or greater than the second preset temperature difference.

Another aspect of the present disclosure provides an electronic memory. The electronic memory comprises a plurality of DRAM chips, and a frequency-adjusting circuit coupled to the plurality of DRAM chips and configured to measure temperatures of the plurality of DRAM chips to determine a refresh frequency for the plurality of DRAM chips. In some embodiments, the frequency-adjusting circuit includes a temperature-sensing module and a computing module. In some embodiments, the temperature-sensing module is configured to measure temperatures of the plurality of DRAM chips. In some embodiments, the computing module is coupled between the temperature-sensing module and the plurality of DRAM chips, and is configured to determine the refresh frequency for the plurality of DRAM chips. In some embodiments, the computing module is configured to compare the temperatures of the plurality of DRAM chips measured by the temperature-sensing module to determine a first temperature, to compare previous temperatures of the plurality of DRAM chips to determine a second temperature, and to determine the refresh frequency based on the first temperature and the second temperature.

In some embodiments, the computing module includes a first comparing unit coupled to the temperature-sensing module and configured to compare the temperatures of the plurality of DRAM chips to obtain the first temperature, which is a highest of the temperatures of the plurality of DRAM chips.

In some embodiments, the computing module further includes a second comparing unit configured to compare the previous temperatures of the plurality of DRAM chips to obtain the second temperature, which is a highest of the previous temperatures of the plurality of DRAM chips.

In some embodiments, the computing module further includes a first computing unit, a third comparing unit and a selection unit. In some embodiments, the first computing unit is coupled to the first comparing unit and the second comparing unit, and is configured to obtain a first temperature difference based on the first temperature and the second temperature. In some embodiments, the third comparing unit is coupled to the first computing unit, and is configured to compare the first temperature difference with a first preset temperature difference. In some embodiments, the selection unit is coupled to the first comparing unit, the second comparing unit and the third comparing unit, and is configured to obtain a third temperature based on results of a comparison between the first temperature difference and the first preset temperature difference.

In some embodiments, the computing module further includes a second computing unit coupled to the selection unit, wherein the second computing unit is configured to compare the third temperature with a preset temperature set to determine the refresh frequency.

In some embodiments, the preset temperature set includes at least one preset temperature defining a first temperature range and a second temperature range. In some embodiments, the second computing unit is configured to output a first preset frequency if the third temperature falls within the first temperature range, and to output a second preset frequency if the third temperature falls within the second temperature range.

In some embodiments, the preset temperature set further includes a second preset temperature difference, and a second temperature difference is defined as a difference between the third temperature and the at least one preset temperature. In some embodiments, when the third temperature is increasing and falls within the second temperature range, the second computing unit is configured to output the first preset frequency if the second temperature difference is less than the second preset temperature difference, and to output the second preset frequency if the second temperature difference is equal to or greater than the second preset temperature difference.

In some embodiments, the preset temperature set further includes a second preset temperature difference, and a second temperature difference is defined as a difference between the third temperature and the at least one preset temperature. In some embodiments, when the third temperature is decreasing and falls within the first temperature range, the second computing unit is configured to output the second preset frequency if the second temperature difference is less than the second preset temperature difference, and to output the first preset frequency if the second temperature difference is equal to or greater than the second preset temperature difference.

Another aspect of the present disclosure provides a method for determining a refresh frequency for a plurality of DRAM chips. The method comprises the following steps. First, a first temperature is determined. Next, a second temperature is determined. Subsequently, the first temperature is compared with the second temperature to obtain a first temperature difference. Next the first temperature difference is compared with a first preset temperature difference to obtain a third temperature. Finally, the refresh frequency for the plurality of DRAM chips is determined based on the third temperature.

In some embodiments, the step of determining the first temperature includes the following sub-steps. First, temperatures of the plurality of DRAM chips are measured. Next, the temperatures of the plurality of DRAM chips are compared. Finally, a highest of the temperatures of the plurality of DRAM chips is selected as the first temperature. In some embodiments, the step of determining the second temperature includes the following sub-steps. First, previous temperatures of the plurality of DRAM chips are read. Next, the previous temperatures of the plurality of DRAM chips are compared. Finally, a highest of the previous temperatures of the plurality of DRAM chips is selected as the second temperature.

In some embodiments, when the first temperature difference is less than the first preset temperature difference, the third temperature is determined to be the same as the second temperature, and when the first temperature difference is equal to or greater than the first preset temperature difference, the third temperature is determined to be the same as the first temperature.

In some embodiments, the step of determining the refresh frequency for the plurality of DRAM chips based on the third temperature includes the following sub-steps. The third temperature is compared with a preset temperature set. The refresh frequency for the plurality of DRAM chips is then determined based on results of a temperature comparison between the third temperature and the preset temperature set.

With the above-mentioned configurations of the frequency-adjusting circuit, a representative temperature of the plurality of DRAM chips can be determined in order to solve the system-shutdown problem without incurring a power-consumption problem, and a refresh frequency for the plurality of DRAM chips can be determined based on the representative temperature of the plurality of DRAM chips. Consequently, the disadvantages of a conventional electronic memory can be alleviated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
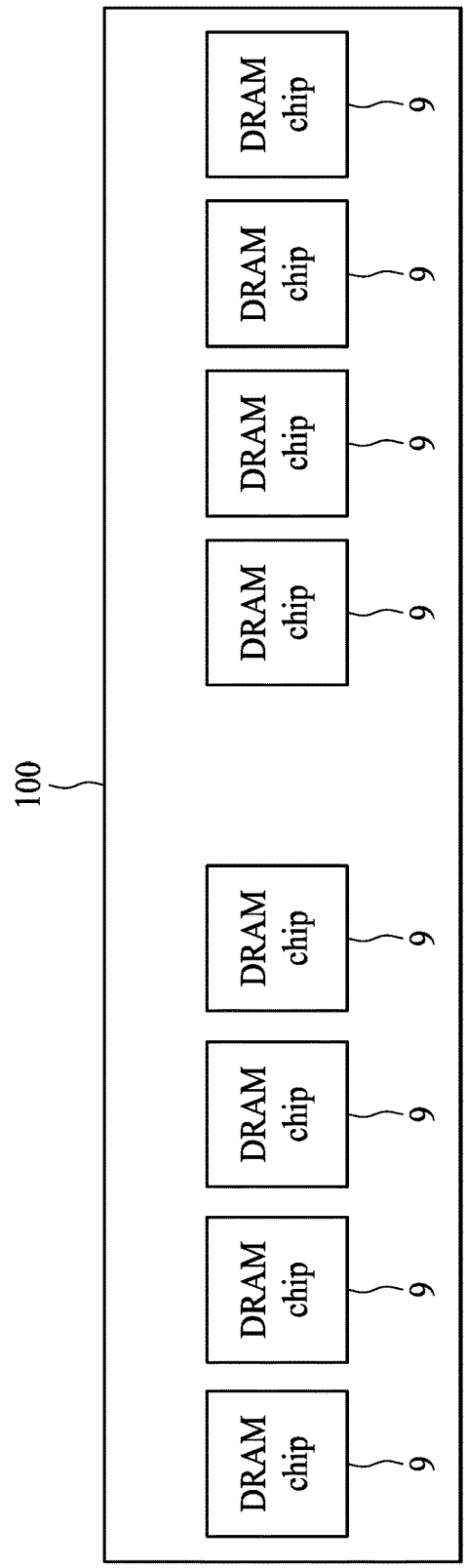
FIG. 1 is a schematic view of an electronic memory in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of an electronic memory 100 in accordance with some embodiments of the present disclosure. Referring to FIG. 1, in some embodiments, the electronic memory 100 includes a plurality of DRAM chips 9. In some embodiments, the electronic memory 100 includes eight DRAM chips 9, while, in some other embodiments, the quantity of the plurality of DRAM chips 9 included in the electronic memory 100 may be varied.

Figure 2:
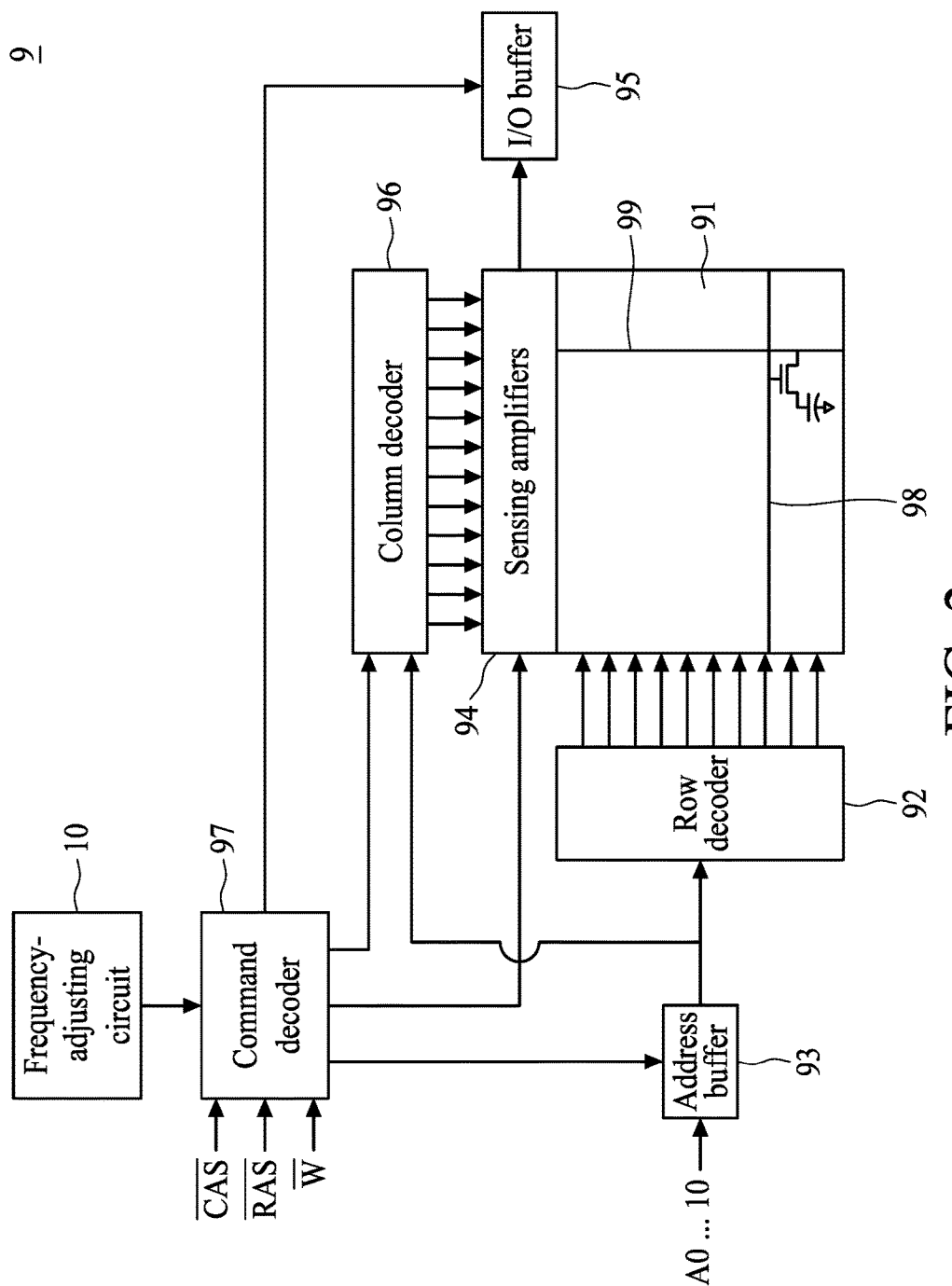
FIG. 2 is a block diagram illustrating a DRAM chip in accordance with some embodiments of the present disclosure.

FIG. 2 is a block diagram illustrating a DRAM chip 9 of the electronic memory 100 in accordance with some embodiments of the present disclosure. Referring to FIG. 2, in some embodiments, each of the plurality of DRAM chips 9 includes a memory array 91; a row decoder 92 coupled to the memory array 91; an address buffer 93 coupled to the row decoder 92; a plurality of sensing amplifiers 94 coupled to the memory array 91; an I/O buffer 95 coupled to the sensing amplifiers 94; a column decoder 96 coupled to the sensing amplifiers 94; a command decoder 97 coupled to the address buffer 93, the column decoder 96, the sensing amplifiers 94 and the I/O buffer 95; a plurality of word lines 98 extending through the memory array 91; and a plurality of bit lines 99 extending through the memory array 91 and intersecting the plurality of word lines 98.

Figure 3:
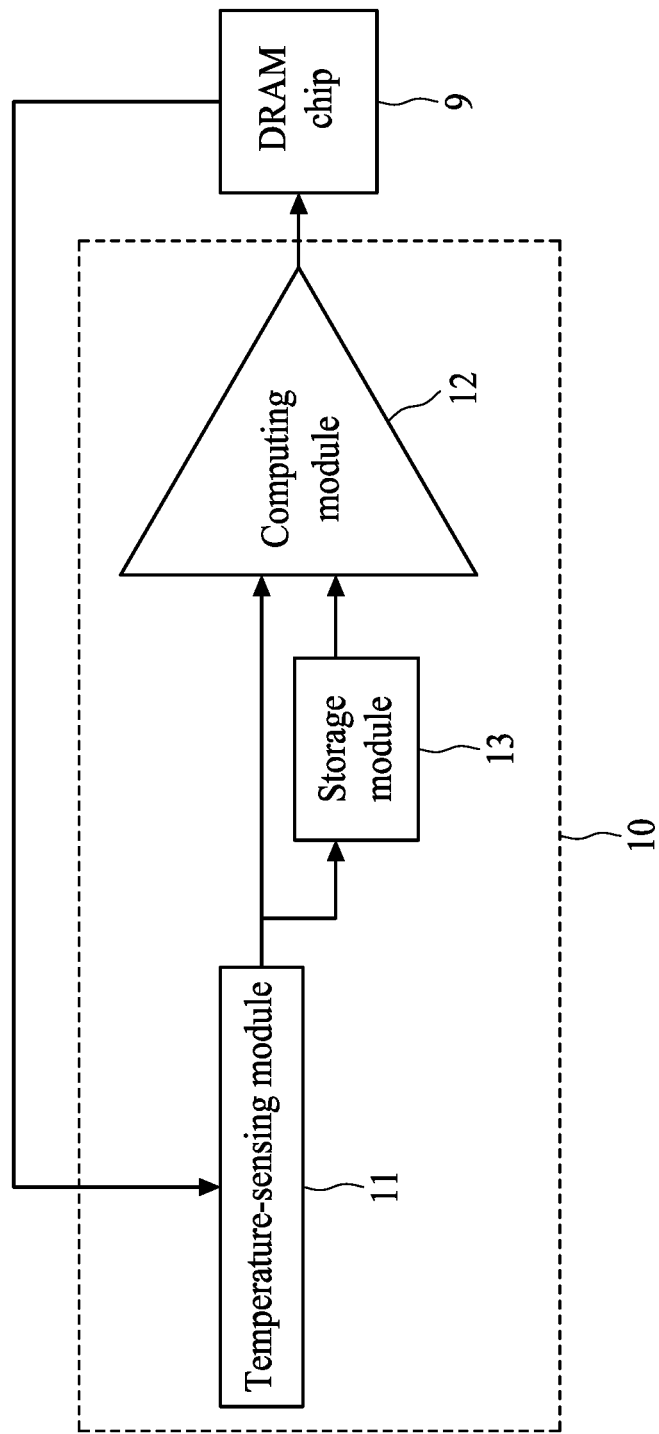
FIG. 3 is a block diagram of a frequency-adjusting circuit in accordance with some embodiments of the present disclosure.

FIG. 3 is a block diagram of a frequency-adjusting circuit 10 in accordance with some embodiments of the present disclosure. In some embodiments, the frequency-adjusting circuit 10 is coupled to the command decoders 97 of the plurality of DRAM chips 9. Referring to FIG. 3, the frequency-adjusting circuit 10 comprises a temperature-sensing module 11, a computing module 12 and a storage module 13. In some embodiments, the temperature-sensing module 11 is configured to measure temperatures of the plurality of DRAM chips 9. In some embodiments, the computing module 12 is coupled between the temperature-sensing module 11 and the plurality of DRAM chips 9, and is configured to determine a refresh frequency (F) for the plurality of DRAM chips 9. In some embodiments, the storage module 13 is coupled between the temperature-sensing module 11 and the computing module 12, and is configured to store the temperatures of is the plurality of DRAM chips 9.

Figure 4:
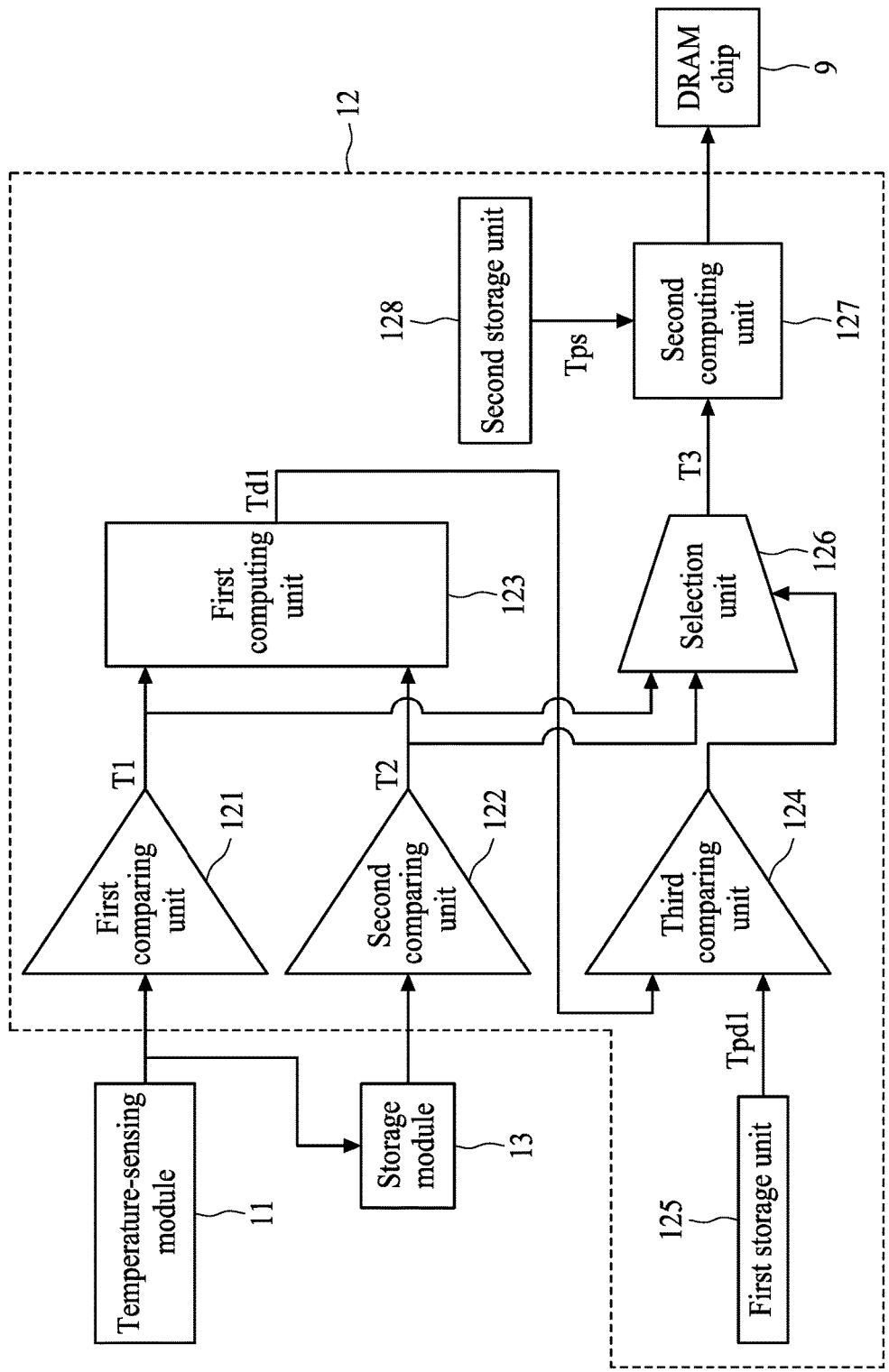
FIG. 4 is a block diagram of a computing module of the frequency-adjusting circuit in accordance with some embodiments of the present disclosure.

FIG. 4 is a block diagram of the computing module 12 of the frequency-adjusting circuit 10 in accordance with some embodiments of the present disclosure. Referring to FIG. 4, in some embodiments, the computing module 12 includes a first comparing unit 121, a second comparing unit 122, a third comparing unit 124, a first computing unit 123, a second computing unit 127 and a selection unit 126.

In some embodiments, the first comparing unit 121 is coupled to the temperature-sensing module 11 and is configured to compare the temperatures of the plurality of DRAM chips 9 to obtain a first temperature (T1), which is a highest of the temperatures of the plurality of DRAM chips 9.

In some embodiments, the second comparing unit 122 is coupled to the storage module 13 and is configured to compare previous temperatures of the plurality of DRAM chips 9 to obtain a second temperature (T2), which is a highest of the previous temperatures of the plurality of DRAM chips 9, wherein the previous temperatures of the plurality of DRAM chips 9 are stored in the storage module 13.

In some embodiments, the first computing unit 123 is coupled to the first comparing unit 121 and the second comparing unit 122, and is configured to compute the first temperature (T1) and the second temperature (T2) to obtain a first temperature difference (Td1).

In some embodiments, the third comparing unit 124 is coupled to the first computing unit 123 and a first storage unit 125, and is configured to compare the first temperature difference (Td1) with a first preset temperature difference (Tpd1), where the first preset temperature difference (Tpd1) is a given numerical value.

In some embodiments, the selection unit 126 is a multiplexer coupled to the first comparing unit 121, the second comparing unit 122 and the third comparing unit 124, and is configured to obtain a third temperature (T3) based on results of a comparison between the first temperature difference (Td1) and the first preset temperature difference (Tpd1). In some embodiments, the third temperature (T3) is defined as a representative temperature of the DRAM chips 9.

In some embodiments, if the first temperature difference (Td1) is less than the first preset temperature difference (Tpd1), the selection unit 126 selects the second temperature (T2) as the third temperature (T3), and the refresh frequency (F) remains unchanged; alternatively, if the first temperature difference (Td1) is equal to or greater than the first preset temperature difference (Tpd1), the selection unit 126 selects the first temperature (T1) as the third temperature (T3), and the refresh frequency (F) is changed. In some embodiments, this design can prevent the electronic memory 100 from frequently changing the refresh frequency (F) of the plurality of DRAM chips 9, thereby mitigating the issue of the electronic memory 100 shutting down when frequently updating the third temperature (T3).

In some embodiments, the second computing unit 127 is coupled to the selection unit 126 and the plurality of DRAM chips 9, and is configured to determine the refresh frequency (F) based on the third temperature (T3). In some embodiments, the second computing unit 127 compares the third temperature (T3) with a preset temperature set (Tps) to determine the refresh frequency (F), wherein the preset temperature set (Tps) includes a first preset temperature (Ta), a second preset temperature (Tb) and a third preset temperature (Tc). In some other embodiments, the quantity of preset temperatures included in the preset temperature set (Tps) may be varied.

Figure 5:
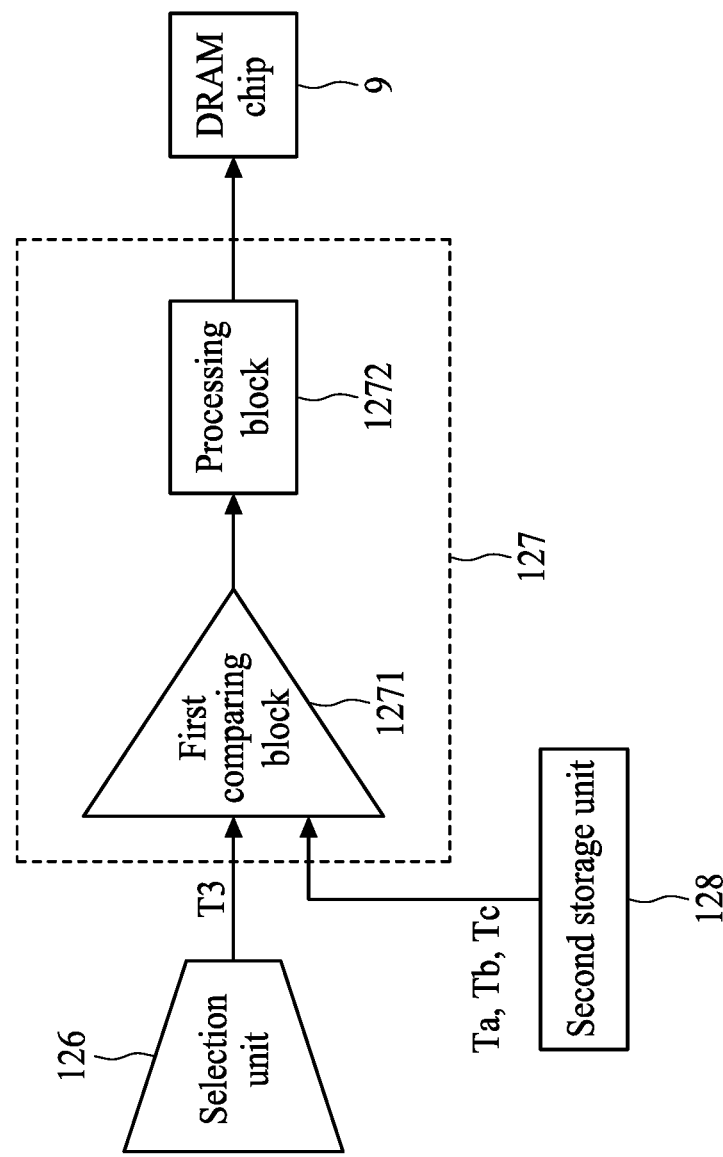
FIG. 5 is a block diagram of a second computing unit of the computing module of the frequency-adjusting circuit in accordance with some embodiments of the present disclosure.

FIG. 5 is a block diagram of the second computing unit 127 of the computing module 12 of the frequency-adjusting circuit 10 in accordance with some embodiments of the present disclosure. Referring to FIG. 5, in some embodiments, the second computing unit 127 includes a first comparing block 1271 and a processing block 1272. The first comparing block 1271 is coupled to the selection unit 126 and the second storage unit 128, and is configured to compare the third temperature (T3) with the first preset temperature (Ta), the second preset temperature (Tb) and the third preset temperature (Tc). The processing block 1272 is coupled to the first comparing block 1271 and the plurality of DRAM chips 9, and is configured to determine the refresh frequency (F) for the plurality of DRAM chips 9 based on a comparison information from the first comparing block 1271.

Figure 6:
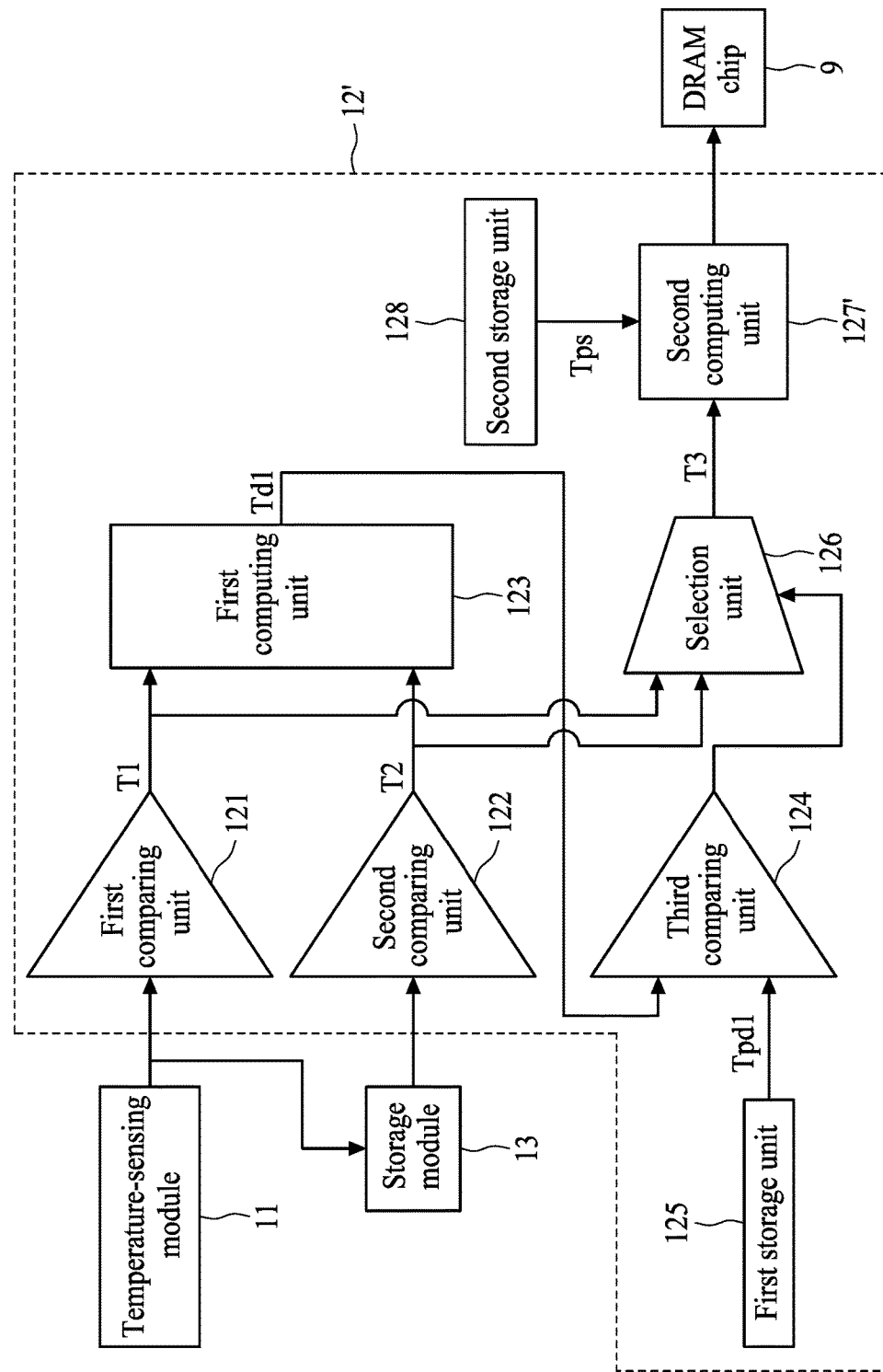
FIG. 6 is a block diagram of another computing module of the frequency-adjusting circuit in accordance with some embodiments of the present disclosure.

FIG. 6 is a block diagram of another computing module 12' of the frequency-adjusting circuit 10 in accordance with some embodiments of the present disclosure. Referring to FIG. 6, in some embodiments, the computing module 12' is substantially similar to the computing module 12 except for the details of the second computing unit 127'.

In some embodiments, the second computing unit 127' is coupled to the selection unit 126 and the plurality of DRAM chips 9, and is configured to determine the refresh frequency (F) based on the third temperature (T3). In some embodiments, the second computing unit 127' compares the third temperature (T3) with the preset temperature set (Tps) to determine the refresh frequency (F), wherein the preset temperature set (Tps) further includes a second preset temperature difference (Tpd2) and a third preset temperature difference (Tpd3). In some other embodiments, the quantity of preset temperatures included in the preset temperature set (Tps) may be varied.

Figure 7:
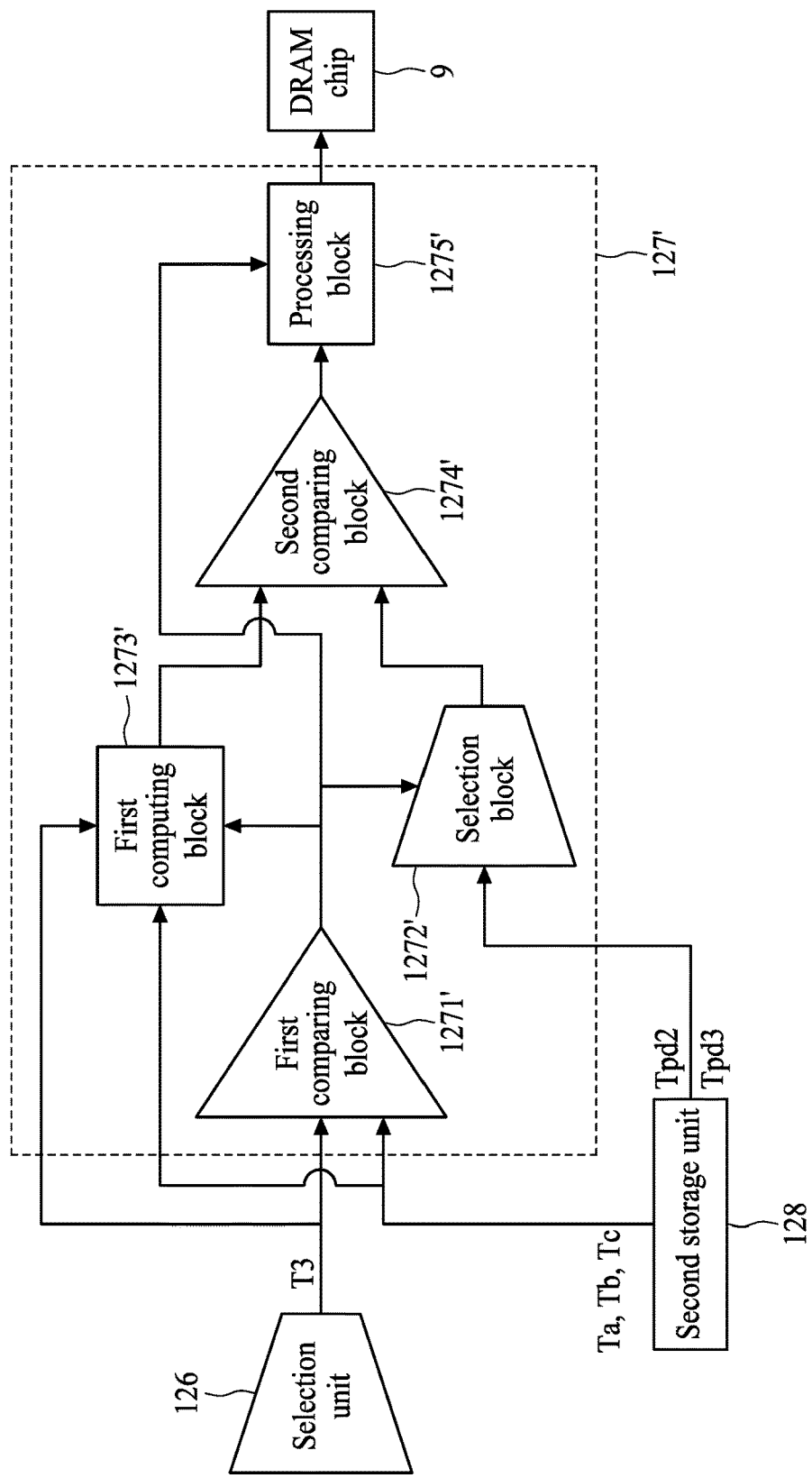
FIG. 7 is a block diagram of another second computing unit of another computing module of the frequency-adjusting circuit in accordance with some embodiments of the present disclosure.

FIG. 7 is a block diagram of the second computing unit 127' of the computing module 12' of the frequency-adjusting circuit 10 in accordance with some embodiments of the present disclosure. Referring to FIG. 7, in some embodiments, the second computing unit 127' includes a first comparing block 1271', a selection block 1272', a first computing block 1273', a second comparing block 1274' and a processing block 1275'.

In some embodiments, the first comparing block 1271' is coupled to the selection unit 126 and the second storage unit 128, wherein the first comparing block 1271' is configured to compare the third temperature (T3) with the first preset temperature (Ta), the second preset temperature (Tb) and the third preset temperature (Tc).

In some embodiments, the selection block 1272' is coupled to the first comparing block 1271' and the second storage unit 128, wherein the selection block 1272' is configured to output one of the second preset temperature difference (Tpd2) and the third preset temperature difference (Tpd3) based on a comparison information from the first comparing block 1271'.

In some embodiments, the first computing block 1273' is coupled to the selection unit 126, the second storage unit 128 and the first comparing block 1271', wherein the first computing block 1273' is configured to generate one of a second temperature difference (Td2) and a third temperature difference (Td3) from the third temperature (T3), the first preset temperature (Ta) and the second preset temperature (Tb) based on the comparison information from the first comparing block 1271'. In some embodiments, the second temperature difference (Td2) is defined as the difference between the third temperature (T3) and the first preset temperature (Ta), and the third temperature difference (Td3) is defined as the difference between the third temperature (T3) and the second preset temperature (Tb).

In some embodiments, when the representative temperature of the DRAM chips 9 is increasing and between the first preset temperature (Ta) and the second preset temperature (Tb), the first computing block 1273' generates the second temperature difference (Tp2) and the selection block 1272' outputs the second preset temperature difference (Tpd2).

In some embodiments, when the representative temperature of the DRAM chips 9 is increasing and between the second preset temperature (Tb) and the third preset temperature (Tc), the first computing block 1273' generates the third temperature difference (Tp3) and the selection block 1272' outputs the third preset temperature difference (Tpd3).

In some embodiments, when the representative temperature of the DRAM chips 9 is decreasing and less than the first preset temperature (Ta), the first computing block 1273' generates the second temperature difference (Tp2) and the selection block 1272' outputs the second preset temperature difference (Tpd2).

In some embodiments, when the representative temperature of the DRAM chips 9 is decreasing and between the first preset temperature (Ta) and the second preset temperature (Tb), the first computing block 1273' generates the third temperature difference (Tp3) and the selection block 1272' outputs the third preset temperature difference (Tpd3).

In some embodiments, the second comparing block 1274' is coupled to the first computing block 1273' and the selection block 1272', wherein the second comparing block 1274' is configured to compare one of the second temperature difference (Td2) and the third temperature difference (Td3) with a corresponding one of the second preset temperature difference (Tpd2) and the third preset temperature difference (Tpd3).

In some embodiments, the processing block 1275' is coupled to the first comparing block 1271', the second comparing block 1274' and the plurality of DRAM chips 9, wherein the processing block 1275' is configured to determine the refresh frequency (F) for the plurality of DRAM chips 9 based on a comparison information from the first comparing block 1271' and the second comparing block 1274'.

In some embodiments, the first preset temperature (Ta), the second preset temperature (Tb), the third preset temperature (Tc), the second preset temperature difference (Tpd2) and the third preset temperature difference (Tpd3) are given numerical values.

Figure 8:
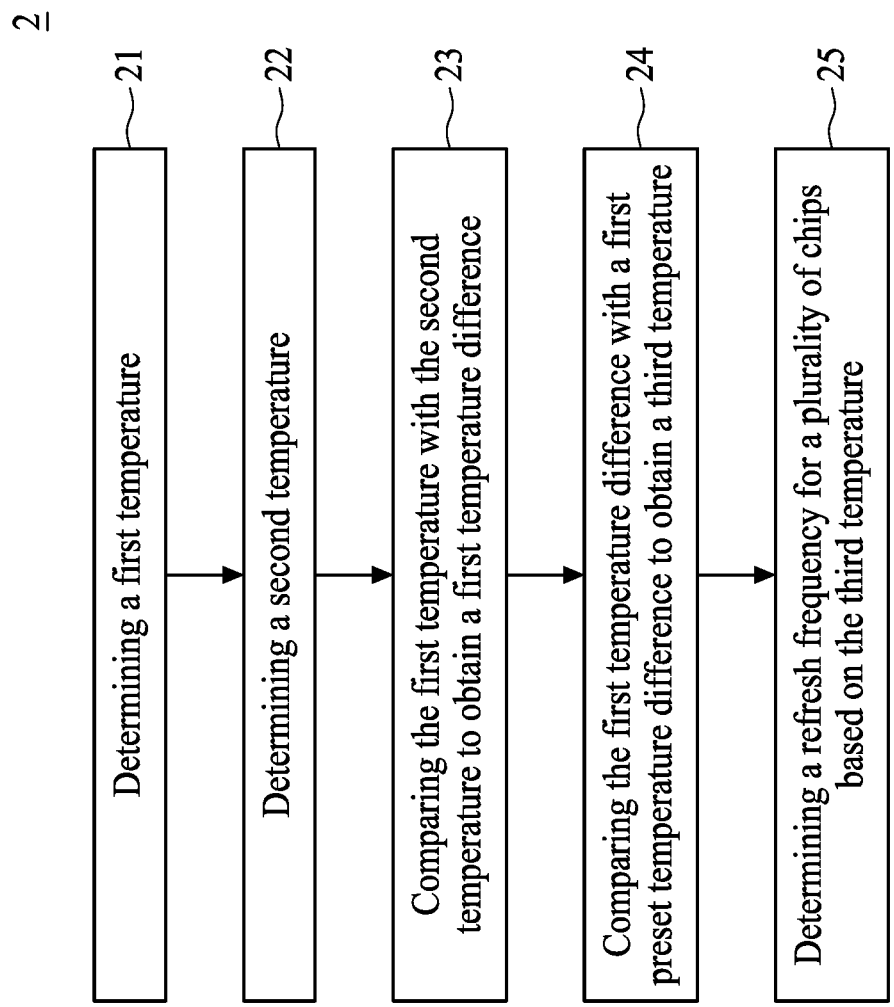
FIG. 8 is a flow chart illustrating a method for determining a refresh frequency for a plurality of DRAM chips in accordance with some embodiments of the present disclosure.

FIG. 8 is a flow chart illustrating a method 2 for determining the refresh frequency (F) for the plurality of DRAM chips 9 in accordance with some embodiments of the present disclosure. Referring to FIG. 3, FIG. 4, FIG. 5 and FIG. 8, in some embodiments, the method 2 includes a step 21, in which the first temperature (T1) is determined; a step 22, in which the second temperature (T2) is determined; a step 23, in which the first temperature (T1) is compared with the second temperature (T2) to obtain the first temperature difference (Td1); a step 24, in which the first temperature difference (Td1) is compared with the first preset temperature difference (Tpd1) to obtain the third temperature (T3); and a step 25, in which the refresh frequency (F) is determined for the DRAM chips 9 based on the third temperature (T3).

In some embodiments, the step of determining the first temperature (T1) comprises the following sub-steps. First, the temperatures of the plurality of DRAM chips 9 are measured. Next, the temperatures of the plurality of DRAM chips 9 are sent to the computing module 12. Next, the temperatures of the plurality of DRAM chips 9 are simultaneously stored in the storage module 13. Next, the temperatures of the plurality of DRAM chips 9 are compared with each other. Finally, the highest of the temperatures of the plurality of DRAM chips 9 is selected as the first temperature (T1).

In some embodiments, the step of determining the second temperature (T2) comprises the following sub-steps. First, the previous temperatures of the plurality of DRAM chips 9 are read from the storage module 13. Next, the previous temperatures of the plurality of DRAM chips 9 are compared with each other. Finally, the highest of the previous temperatures of the plurality of DRAM chips 9 is selected as the second temperature (T2).

In some embodiments, the step of determining the refresh frequency (F) for the plurality of DRAM chips 9 comprises the following sub-steps. First, the third temperature (T3) is compared with the preset temperature set (Tps). Next, the refresh frequency (F) for the plurality of DRAM chips 9 is determined based on results of a temperature comparison between the third temperature (T3) and the preset temperature set (Tps).

Referring to FIG. 6, FIG. 7 and FIG. 8, in some embodiments, the sub-step of determining the refresh frequency (F) for the plurality of DRAM chips 9 based on the results of the temperature comparison between the third temperature (T3) and the preset temperature set (Tps) comprises the following sub-steps. First, the preset temperature range within which the third temperature (T3) falls is confirmed. Next, the second temperature difference (Td2) is compared with the second preset temperature difference (Tpd2). Finally, a corresponding frequency is selected as the refresh frequency (F).

In some embodiments, during a refresh frequency-determining process, the third temperature (T3) is first compared with the first, second and third preset temperatures (Ta, Tb, Tc) to confirm which preset temperature range the third temperature falls within. Next, the corresponding frequency is selected as the refresh frequency (F). Subsequently, a refresh frequency information is output to the plurality of DRAM chips 9.

In some embodiments, during the process of determining the refresh frequency, after the preset temperature range within which the third temperature falls is confirmed, one of the second temperature difference (Td2) and the third temperature difference (Td3) is obtained. Subsequently, the one of the second temperature difference (Td2) and the third temperature difference (Td3) is compared with the corresponding one of the second preset temperature difference (Tpd2) and the third preset temperature difference (Tpd3). Finally, the corresponding frequency is selected as the refresh frequency (F). In some embodiments, after the refresh frequency (F) is determined, a refresh frequency information is output to the plurality of DRAM chips 9.

In some embodiments, when the representative temperature of the DRAM chips 9 is increasing and is between the first preset temperature (Ta) and the second preset temperature (Tb), the second temperature difference (Td2) is compared with the second present temperature difference (Tpd2).

In some embodiments, when the representative temperature of the DRAM chips 9 is increasing and is between the second preset temperature (Tb) and the third preset temperature (Tc), the third temperature difference (Td3) is compared with the third preset temperature difference (Tpd3).

In some embodiments, when the representative temperature of the DRAM chips 9 is decreasing and is less than the first preset temperature (Ta), the second temperature difference (Td2) is compared with the second present temperature difference (Tpd2).

In some embodiments, when the representative temperature of the DRAM chips 9 is decreasing and is between the first preset temperature (Ta) and the second preset temperature (Tb), the third temperature difference (Td3) is compared with the third present temperature difference (Tpd3).

Figure 9:
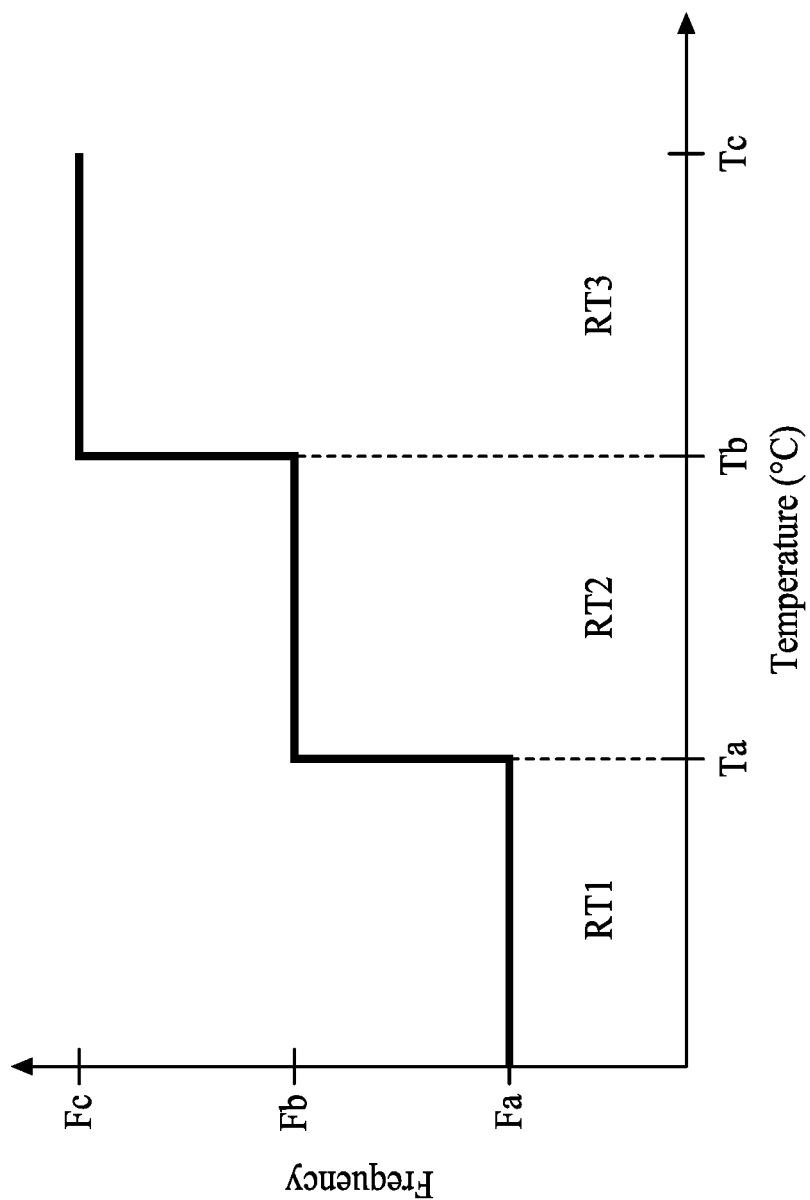
FIG. 9 is a schematic plot showing the relationship between a representative temperature of the plurality of DRAM chips and the refresh frequency for the plurality of DRAM chips in accordance with some embodiments of the present disclosure.

FIG. 9 is a schematic plot showing the relationship between the representative temperature and the refresh frequency (F) for the plurality of DRAM chips 9 in accordance with some embodiments of the present disclosure. In some embodiments, the preset temperature set includes at least one preset temperature defining a first temperature range and a second temperature range; for example, the first preset temperature (Ta) defines a first temperature range (RT1) and a second temperature range (RT2). Referring to FIG. 9, in some embodiments, the preset temperature set (Tps) defines a plurality of preset temperature ranges. In some embodiments, the first preset temperature (Ta) and zero degrees Celsius define a first temperature range (RT1), the first and second preset temperatures (Ta, Tb) define a second temperature range (RT2), and the second and third preset temperatures (Tb, Tc) define a third temperature range (RT3).

Referring to FIG. 9, in some embodiments, the refresh frequency (F) for the plurality of DRAM chips 9 is determined to be a first preset frequency (Fa) if the third temperature (T3) falls within the first temperature range (RT1), a second preset frequency (Fb) if the third temperature (T3) falls within the second temperature range (RT2), or a third preset frequency (Fc) if the third temperature (T3) falls within the third temperature range (RT3). In some embodiments, the first preset frequency (Fa) is less than the second preset frequency (Fb), and the second preset frequency (Fb) is less than the third preset frequency (Fc).

Figure 10:
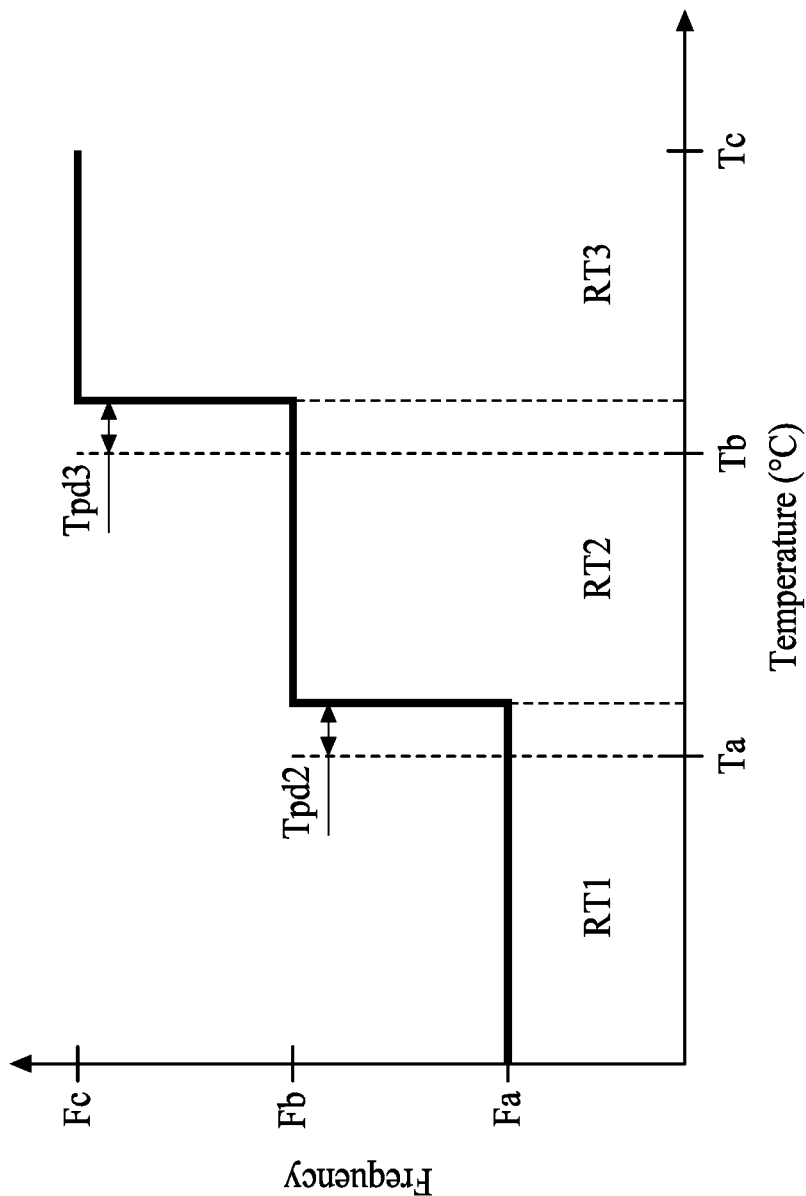
FIG. 10 is another schematic plot showing the relationship between the representative temperature of the plurality of DRAM chips and the refresh frequency for the plurality of DRAM chips in accordance with some embodiments of the present disclosure.

FIG. 10 is a schematic plot showing the relationship between the representative temperature of the plurality of DRAM chips 9 and the refresh frequency (F) for the plurality of DRAM chips 9 in accordance with some embodiments of the present disclosure. Referring to FIG. 10, in some embodiments, when the representative temperature of the plurality of DRAM chips 9 is increasing, and if the second temperature difference (Td2) is less than the second preset temperature difference (Tpd2), then the refresh frequency (F) for the DRAM chips 9 is determined to be the first preset frequency (Fa), even if the third temperature (T3) falls within the second temperature range (RT2). In some embodiments, when the second temperature difference (Td2) is less than the second preset temperature difference (Tpd2), i.e., when the temperature variation between the present measurement and the previous measurement is sufficiently small (less than Tpd2), then it is not necessary to change the refresh frequency (F); therefore, the refresh frequency (F) for the plurality of DRAM chips 9 is maintained at the first preset frequency (Fa) in order to alleviate an operating burden of the electronic memory 100.

Referring to FIG. 10, in some embodiments, when the representative temperature of the plurality of DRAM chips 9 is increasing, and if the third temperature (T3) falls within the second temperature range (RT2) and the second temperature difference (Td2) is equal to or greater than the second preset temperature difference (Tpd2), then the refresh frequency (F) for the DRAM chips 9 is determined to be the second preset frequency (Fb). In some embodiments, when the second temperature difference (Td2) is equal to or greater than the second preset temperature difference (Tpd2), i.e., when the temperature variation between the present measurement and the previous measurement is sufficiently large (equal to or greater than Tpd2), then it is necessary to change the refresh frequency (F); therefore, the refresh frequency (F) for the plurality of DRAM chips 9 needs to be increased to the second preset frequency (Fb) in order to prevent data loss.

Referring to FIG. 10, in some embodiments, when the representative temperature of the plurality of DRAM chips 9 is increasing, and if the third temperature difference (Td3) is less than the third preset temperature difference (Tpd3), then the refresh frequency (F) for the DRAM chips 9 is determined to be the second preset frequency (Fb), even if the third temperature (T3) falls within the third temperature range (RT3). In some embodiments, when the third temperature difference (Td3) is less than the third preset temperature difference (Tpd3), i.e., when the temperature variation between the present measurement and the previous measurement is sufficiently small (less than Tpd3), then it is not necessary to change the refresh frequency (F); therefore, the refresh frequency (F) for the plurality of DRAM chips 9 is maintained at the second preset frequency (Fb) in order to alleviate the operating burden of the electronic memory 100.

Referring to FIG. 10, in some embodiments, when the representative temperature of the plurality of DRAM chips 9 is increasing, and if the third temperature (T3) falls within the third temperature range (RT3) and the third temperature difference (Td3) is equal to or greater than the third preset temperature difference (Tpd3), then the refresh frequency (F) for the DRAM chips 9 is determined to be the third preset frequency (Fc). In some embodiments, when the third temperature difference (Td3) is equal to or greater than the third preset temperature difference (Tpd3), i.e., when the temperature variation between the present measurement and the previous measurement is sufficiently large (equal to or greater than Tpd3), then it is necessary to change the refresh frequency (F); therefore, the refresh frequency (F) for the plurality of DRAM chips 9 needs to be increased to the third preset frequency (Fc) in order to prevent data loss.

Figure 11:
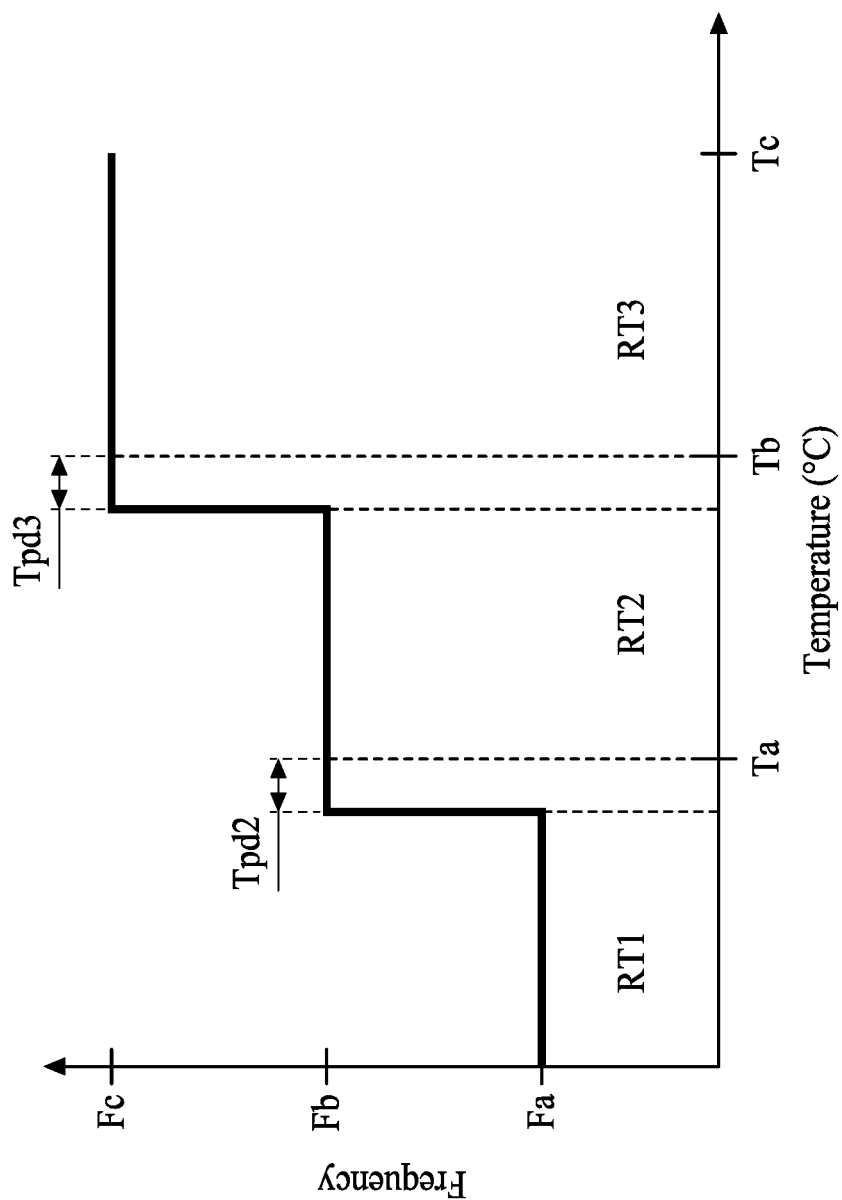
FIG. 11 is another schematic plot showing the relationship between the representative temperature of the plurality of DRAM chips and the refresh frequency for the plurality of DRAM chips in accordance with some embodiments of the present disclosure.

FIG. 11 is another schematic plot showing the relationship between the representative temperature of the plurality of DRAM chips 9 and the refresh frequency (F) for the plurality of DRAM chips 9 in accordance with some embodiments of the present disclosure. Referring to FIG. 11, in some embodiments, when the representative temperature of the plurality of DRAM chips 9 is decreasing, and if the third temperature difference (Td3) is less than the third preset temperature difference (Tpd3), then the refresh frequency (F) for the DRAM chips 9 is determined to be the third preset frequency (Fc), even if the third temperature (T3) falls within the second temperature range (RT2). In some embodiments, when the third temperature difference (Td3) is less than the third preset temperature difference (Tpd3), i.e., when the temperature variation between the present measurement and the previous measurement is sufficiently small (less than Tpd3), then it is not necessary to change the refresh frequency (F); therefore, the refresh frequency (F) for the plurality of DRAM chips 9 is maintained at the third preset frequency (Fc) in order to alleviate the operating burden of the electronic memory 100.

Referring to FIG. 11, in some embodiments, when the representative temperature of the plurality of DRAM chips 9 is decreasing, and if the third temperature (T3) falls within the second temperature range (RT2) and the third temperature difference (Td3) is equal to or greater than the third preset temperature difference (Tpd3), then the refresh frequency (F) for the DRAM chips 9 is determined to be the second preset frequency (Fb). In some embodiments, when the third temperature difference (Td3) is equal to or greater than the third preset temperature difference (Tpd3), i.e., when the temperature variation between the present measurement and the previous measurement is sufficiently large (equal to or greater than Tpd3), it is necessary to change the refresh frequency (F); therefore, the refresh frequency (F)

for the plurality of DRAM chips 9 needs to be decreased to the second preset frequency (Fb) in order to prevent a power-consumption problem.

Referring to FIG. 11, in some embodiments, when the representative temperature of the plurality of DRAM chips 9 is decreasing, and if the second temperature difference (Td2) is less than the second preset temperature difference (Tpd2), then the refresh frequency (F) for the DRAM chips 9 is determined to be the second preset frequency (Fb, even if the third temperature (T3) falls within the first temperature range (RT1). In some embodiments, when the second temperature difference (Td2) is less than the second preset temperature difference (Tpd2), i.e., when the temperature variation between the present measurement and the previous measurement is sufficiently small (less than Tpd2), it is not necessary to change the refresh frequency (F); therefore, the refresh frequency (F) for the plurality of DRAM chips 9 is maintained at the second preset frequency (Fb) in order to alleviate the operating burden of the electronic memory 100.

Referring to FIG. 11, in some embodiments, when the representative temperature of the plurality of DRAM chips 9 is decreasing, and if the third temperature (T3) falls within the first temperature range (RT1) and the second temperature difference (Td2) is equal to or greater than the second preset temperature difference (Tpd2), then the refresh frequency (F) for the DRAM chips 9 is determined to be the first preset frequency (Fa). In some embodiments, when the second temperature difference (Td2) is equal to or greater than the second preset temperature difference (Tpd2), i.e., when the temperature variation between the present measurement and the previous measurement is sufficiently large (equal to or greater than Tpd2), then it is necessary to change the refresh frequency (F); therefore, the refresh frequency (F) for the plurality of DRAM chips 9 needs to be decreased to the first preset frequency (Fa) in order to prevent the power-consumption problem.

In some embodiments, because the third temperature (T3) is the highest of the temperatures of the plurality of DRAM chips 9, when the representative temperature is decreasing and when the third temperature difference (Td3) between the third temperature (T3) and the second preset temperature (Tb) is equal to or greater than the third preset temperature difference (Tpd3), then the third temperature difference (Td3) between each of the temperatures of the plurality of DRAM chips 9 and the second preset temperature difference (Tpd3).

Similarly, in some embodiments, when the representative temperature is decreasing and when the second temperature difference (Td2) between the third temperature (T3) and the first preset temperature (Ta) is equal to or greater than the second preset temperature difference (Tpd2), then the second temperature difference (Td2) between each of the temperatures of the plurality of DRAM chips 9 and the first preset temperature (Ta) is determined to be equal to or greater than the second preset temperature difference (Tpd2).

Similarly, in some embodiments, when the representative temperature is increasing and when the second temperature difference (Td2) between the third temperature (T3) and the first preset temperature (Ta) is equal to or greater than the second preset temperature difference (Tpd2), then the second temperature difference (Td2) between each of the temperatures of the plurality of DRAM chips 9 and the first preset temperature (Ta) is determined to be equal to or greater than the second preset temperature difference (Tpd2).

Similarly, in some embodiments, when the representative temperature is increasing and when the third temperature difference (Td3) between the third temperature (T3) and the second preset temperature (Tb) is equal to or greater than the third preset temperature difference (Tpd3), then the third temperature difference (Td3) between each of the temperatures of the plurality of DRAM chips 9 and the second preset temperature (Tb) is determined to be equal to or greater than the third preset temperature difference (Tpd3).

In some embodiments, the second preset temperature difference (Tpd2) is the same as the third preset temperature difference (Tpd3), while, in sonic other embodiments, the second preset temperature difference (Tpd2) may be different from the third preset temperature difference (Tpd3).

In some embodiments, the second preset temperature difference (Tpd2) set when the representative temperature is increasing is the same as the second preset temperature difference (Tpd2) set when the representative temperature is decreasing. In some other embodiments, the second preset temperature difference (Tpd2) set when the representative temperature is increasing may be different from the second preset temperature difference (Tpd2) set when the representative temperature is decreasing.

In some embodiments, the third preset temperature difference (Tpd3) set when the representative temperature is increasing is the same as the third preset temperature difference (Tpd3) set when the representative temperature is decreasing. In some other embodiments, the third preset temperature difference (Tpd3) set when the representative temperature is increasing may be different from the third preset temperature difference (Tpd3) set when the representative temperature is decreasing.

In some embodiments, the storage module 13, the first storage unit 125 and the second storage unit 128 are configured as registers. In some other embodiments, the configurations of the storage module 13, the first storage unit 125 and the second storage unit 128 may be varied.

In some embodiments, the first storage unit 125 provides the first preset temperature difference (Tpd1) to the third comparing unit 124. In some embodiments, the second storage unit 128 provides the preset temperature set (Tps) to the second computing unit 127. In some other embodiments, the arrangements of the first and second storage units 125 and 128 may be varied.

In some embodiments, the first preset temperature (Ta) is 45 degrees Celsius, the second preset temperature (Tb) is 85 degrees Celsius, the third preset temperature (Tc) is 95 degrees Celsius, and the first, second and third preset temperature differences (Tpd1, Tpd2, Tpd3) are 5 degrees Celsius. In some other embodiments, the value of the first preset temperature (Ta), the second preset temperature (Tb), the third preset temperature (Tc), the first preset temperature difference (Tpd1), the second preset temperature difference (Tpd2) and the third preset temperature difference (Tpd3) may be varied.

In conclusion, with the configurations of the frequency-adjusting circuit 10, the representative temperature of the DRAM chips 9 can be determined without incurring the system-shutdown problem, and the refresh frequency (F) for the DRAM chips 9 can be determined based on the representative temperature of the DRAM chips 9. Consequently, the objective of the disclosure is achieved.

One aspect of the present disclosure provides a frequency-adjusting circuit. The frequency-adjusting circuit comprises a temperature-sensing module and a computing module. The temperature-sensing module is configured to measure temperatures of a plurality of DRAM chips. The computing module is coupled to the temperature-sensing module and is configured to determine a refresh frequency for the plurality of DRAM chips. In some embodiments, the computing module is configured to compare the temperatures of the plurality of DRAM chips measured by the temperature-sensing module to determine a first temperature, to compare previous temperatures of the plurality of DRAM chips to determine a second temperature, and to determine the refresh frequency based on the first temperature and the second temperature.

One aspect of the present disclosure provides an electronic memory. The electronic memory comprises a plurality of DRAM chips, and a frequency-adjusting circuit coupled to the plurality of DRAM chips and configured to measure temperatures of the plurality of DRAM chips to determine a refresh frequency for the plurality of DRAM chips. In some embodiments, the frequency-adjusting circuit includes a temperature-sensing module and a computing module. In some embodiments, the temperature-sensing module is configured to measure temperatures of the plurality of DRAM chips. In some embodiments, the computing module is coupled between the temperature-sensing module and the plurality of DRAM chips, and is configured to determine the refresh frequency for the plurality of DRAM chips. In some embodiments, the computing module is configured to compare the temperatures of the plurality of DRAM chips measured by the temperature-sensing module to determine a first temperature, to compare previous temperatures of the plurality of DRAM chips determine a second temperature, and to determine the refresh frequency based on the first temperature and the second temperature.

One aspect of the present disclosure provides a method for determining a refresh frequency for a plurality of DRAM chips. The method comprises the following steps. First, a first temperature is determined. Next, a second temperature is determined. Subsequently, the first temperature is compared with the second temperature to obtain a first temperature difference. Next, the first temperature difference is compared with a first preset temperature difference to obtain a third temperature. Finally, the refresh frequency for the plurality of DRAM chips is determined based on the third temperature.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A frequency-adjusting circuit, comprising:
 a temperature-sensing module configured to measure temperatures of a plurality of DRAM chips; and
 a computing module coupled to the temperature-sensing module and configured to determine a refresh frequency for the plurality of DRAM chips;
 wherein the computing module is configured to compare the temperatures of the plurality of DRAM chips measured by the temperature-sensing module to determine a first temperature, to compare previous temperatures of the plurality of DRAM chips to determine a second temperature, to compare the first temperature and the second temperature to obtain a first temperature difference, and to determine the refresh frequency based on a comparison between the first temperature difference and a first preset temperature difference.

2. The frequency-adjusting circuit of claim 1, wherein the computing module includes a first comparing unit coupled to the temperature-sensing module and configured to compare the temperatures of the plurality of DRAM chips to obtain the first temperature, which is a highest temperature of the temperatures of the plurality of DRAM chips.

3. The frequency-adjusting circuit of claim 2, wherein the computing module further includes a second comparing unit configured to compare the previous temperatures of the plurality of DRAM chips to obtain the second temperature, which is a highest temperature of the previous temperatures of the plurality of DRAM chips.

4. The frequency-adjusting circuit of claim 3, wherein the computing module further includes:
 a first computing unit coupled to the first comparing unit and the second comparing unit, and configured to obtain the first temperature difference based on the first temperature and the second temperature;
 a third comparing unit coupled to the first computing unit, and configured to compare the first temperature difference with the first preset temperature difference; and
 a selection unit coupled to the first comparing unit, the second comparing unit and the third comparing unit, and configured to obtain a third temperature based on results of a comparison between the first temperature difference and the first preset temperature difference.

5. The frequency-adjusting circuit of claim 4, wherein the computing module further includes a second computing unit coupled to the selection unit, and configured to compare the third temperature with a preset temperature set to determine the refresh frequency.

6. The frequency-adjusting circuit of claim 5, wherein:
 the preset temperature set includes at least one preset temperature defining a first temperature range and a second temperature range; and
 the second computing unit is configured to output a first preset frequency if the third temperature falls within the first temperature range, and
 the second computing unit is configured to output a second preset frequency if the third temperature falls within the second temperature range.

7. The frequency-adjusting circuit of claim 6, wherein:
 the preset temperature set further includes a second preset temperature difference, and a second temperature difference is defined as a difference between the third temperature and the at least one preset temperature; and
 when the third temperature is increasing and falls within the second temperature range,
 the second computing unit is configured to output the first preset frequency if the second temperature difference is less than the second preset temperature difference, and
 the second computing unit is configured to output the second preset frequency if the second temperature difference is equal to or greater than the second preset temperature difference.

8. The frequency-adjusting circuit of claim 6, wherein:
the preset temperature set further includes a second preset temperature difference, and a second temperature difference is defined as a difference between the third temperature and the at least one preset temperature; and
when the third temperature is decreasing and falls within the first temperature range, the second computing unit is configured to output the second preset frequency if the second temperature difference is less than the second preset temperature difference, and
the second computing unit is configured to output the first preset frequency if the second temperature difference is equal to or greater than the second preset temperature difference.

9. An electronic memory, comprising:
a plurality of DRAM chips; and
a frequency-adjusting circuit coupled to the plurality of DRAM chips, and configured to measure temperatures of the plurality of DRAM chips to determine a refresh frequency for the plurality of DRAM chips,
wherein the frequency-adjusting circuit includes:
a temperature-sensing module configured to measure temperatures of the plurality of DRAM chips, and
a computing module coupled between the temperature-sensing module and the plurality of DRAM chips, and configured to determine the refresh frequency for the plurality of DRAM chips; and
wherein the computing module is configured to compare the temperatures of the plurality of DRAM chips measured by the temperature-sensing module to determine a first temperature, to compare previous temperatures of the plurality of DRAM chips to determine a second temperature, to compare the first temperature and the second temperature to obtain a first temperature difference, and to determine the refresh frequency based on a comparison between the first temperature difference and a first preset temperature difference.

10. The electronic memory of claim 9, wherein the computing module includes a first comparing unit coupled to the temperature-sensing module and configured to compare the temperatures of the plurality of DRAM chips to obtain the first temperature, which is a highest of the temperatures of the plurality of DRAM chips.

11. The electronic memory of claim 10, wherein the computing module further includes a second comparing unit configured to compare the previous temperatures of the plurality of DRAM chips to obtain the second temperature, which is a highest of the previous temperatures of the plurality of DRAM chips.

12. The electronic memory of claim 11, wherein the computing module further includes:
a first computing unit coupled to the first comparing unit and the second comparing unit, and configured to obtain the first temperature difference based on the first temperature and the second temperature;
a third comparing unit coupled to the first computing unit, and configured to compare the first temperature difference with the first preset temperature difference; and
a selection unit coupled to the first comparing unit, the second comparing unit and the third comparing unit, and configured to obtain a third temperature based on results of a comparison between the first temperature difference and the first preset temperature difference.

13. The electronic memory of claim 12, wherein the computing module further includes a second computing unit coupled to the selection unit, and configured to compare the third temperature with a preset temperature set to determine the refresh frequency.

14. The electronic memory of claim 13, wherein:
the preset temperature set includes at least one preset temperature defining a first temperature range and a second temperature range; and
the second computing unit is configured to output a first preset frequency if the third temperature falls within the first temperature range, and
the second computing unit is configured to output a second preset frequency if the third temperature falls within the second temperature range.

15. The electronic memory of claim 14, wherein:
the preset temperature set further includes a second preset temperature difference, and a second temperature difference is defined as a difference between the third temperature and the at least one preset temperature; and
when the third temperature is increasing and falls within the second temperature range, the second computing unit is configured to output the first preset frequency if the second temperature difference is less than the second preset temperature difference, and
the second computing unit is configured to output the second preset frequency if the second temperature difference is equal to or greater than the second preset temperature difference.

16. The electronic memory of claim 14, wherein:
the preset temperature set further includes a second preset temperature difference, and a second temperature difference is defined as a difference between the third temperature and the at least one preset temperature; and
when the third temperature is decreasing and falls within the first temperature range, the second computing unit is configured to output the second preset frequency if the second temperature difference is less than the second preset temperature difference, and
the second computing unit is configured to output the first preset frequency if the second temperature difference is equal to or greater than the second preset temperature difference.

17. A method for determining a refresh frequency for a plurality of DRAM chip, comprising:
determining a first temperature;
determining a second temperature;
comparing the first temperature with the second temperature to obtain a first temperature difference;
comparing the first temperature difference with a first preset temperature difference;
maintaining the refresh frequency of the plurality of DRAM of the plurality of DRAM chips when the first temperature difference is less than the first preset temperature; and
changing the refresh frequency of the DRAM chips when the first temperature difference is equal to or greater than the first preset temperature difference.

18. The method of claim 17, wherein:
the step of determining the first temperature includes:
measuring temperatures of the plurality of DRAM chips,
comparing the temperatures of the plurality of DRAM chips, and
selecting a highest of the temperature of the plurality of DRAM chips as the first temperature; and
the step of determining the second temperature includes:
reading previous temperatures of the plurality of DRAM chips, comparing the previous temperatures of the plurality of DRAM chips, and selecting a highest of the previous temperatures of the plurality of DRAM chips as the second temperature.

19. The method of claim 17, wherein when the first temperature difference is less than the first preset temperature difference, a third temperature obtained by comparing the first temperature difference with the first preset temperature difference is determined to be the same as the second temperature, and when the first temperature difference is equal to or greater than the first preset temperature difference, the third temperature is determined to be the same as the first temperature.

20. The method of claim 19, further comprising:

comparing the third temperature with a preset temperature set; and determining to change the refresh frequency for the plurality of DRAM chips based on results of a temperature comparison between the third temperature and the preset temperature set.

* * * * *